US012464605B2

(12) United States Patent
Moore et al.

(10) Patent No.: US 12,464,605 B2
(45) Date of Patent: Nov. 4, 2025

(54) ACTIVE COOLING OF QUARTZ ENVELOPED HEATERS IN VACUUM

(71) Applicant: Applied Materials, Inc., Santa Clara, CA (US)

(72) Inventors: Dursun Moore, Austin, TX (US); Julian G. Blake, Gloucester, MA (US); Hillman Bailey, Dripping Springs, TX (US); James D. Strassner, Austin, TX (US); Paul Forderhase, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 956 days.

(21) Appl. No.: 17/583,755

(22) Filed: Jan. 25, 2022

(65) Prior Publication Data

US 2023/0239970 A1 Jul. 27, 2023

(51) Int. Cl.
*H05B 3/00* (2006.01)
*H01J 37/317* (2006.01)
*H05B 3/44* (2006.01)

(52) U.S. Cl.
CPC ........ *H05B 3/0033* (2013.01); *H01J 37/3171* (2013.01); *H05B 3/44* (2013.01);
(Continued)

(58) Field of Classification Search
CPC ......... H01J 2237/002; H01J 2237/2001; H01J 2237/31701; H01J 37/3002; H01J 37/3171; H01K 1/58; H01K 1/325; H05B 3/0033; H05B 3/0047; H05B 3/44; H01L 21/26; H01L 21/324; F27D 11/00;
(Continued)

(56) References Cited

U.S. PATENT DOCUMENTS 6,399,955 B1 * 6/2002 Fannon .................... H01K 7/00
250/493.1
10,925,146 B1 2/2021 Ryan et al.
(Continued)

FOREIGN PATENT DOCUMENTS

JP 60-59689 A 4/1985
JP 2006-126827 A 5/2006
(Continued)

OTHER PUBLICATIONS

Vocabulary definition of "emissive" (Year: 2025).*
International Search Report and Written Opinion mailed May 9, 2023 in corresponding PCT application No. PCT/US2023/010275.

*Primary Examiner* — Sang Y Paik
*Assistant Examiner* — Bonita Khlok
(74) *Attorney, Agent, or Firm* — Nields, Lemack & Frame, LLC

(57) ABSTRACT

A heater assembly that that is effective at maintaining heating lamps at acceptable temperatures is disclosed. The heater assembly utilizes radiative heat transfer to transfer unwanted heat buildup in the heating lamps to a cooling base. One or more high emissivity films are disposed between the heating lamps and the cooling base to facilitate heat transfer. Further, a reflective coating is applied to a portion of the heating lamps to reflect heat away from the cooling base. The heater assembly may be utilized in a high vacuum environment as it does not rely on convective cooling.

10 Claims, 9 Drawing Sheets

(52) U.S. Cl.
CPC .................... *H01J 2237/002* (2013.01); *H01J 2237/31701* (2013.01)

(58) Field of Classification Search
CPC ............... F27D 11/08–12; F27D 15/02; C23C 16/46–463
USPC ............... 219/405, 411; 362/218; 250/492.2, 250/493.1–495.1; 392/407, 422–424
See application file for complete search history.

(56) References Cited

U.S. PATENT DOCUMENTS

| | | | | |
|---|---|---|---|---|
| 2004/0104682 | A1 | 6/2004 | Horsky et al. | |
| 2006/0139744 | A1 | 6/2006 | Merhtens et al. | |
| 2007/0002923 | A1* | 1/2007 | Mehrtens | C23C 28/34 372/93 |
| 2008/0315744 | A1* | 12/2008 | Monteix | H05B 3/0038 313/113 |
| 2010/0054720 | A1* | 3/2010 | Hunter | H01L 21/67248 392/416 |
| 2015/0071623 | A1* | 3/2015 | Ranish | H05B 1/0233 392/428 |
| 2021/0242054 | A1* | 8/2021 | Chen | G01B 7/08 |
| 2021/0291450 | A1* | 9/2021 | Barnes | B33Y 30/00 |

FOREIGN PATENT DOCUMENTS

| | | | |
|---|---|---|---|
| JP | 2012-140684 | A | 7/2012 |
| JP | 2018-200971 | A | 12/2018 |
| KR | 2009-0130959 | A | 12/2009 |
| KR | 10-1458001 | B1 | 11/2014 |
| KR | 2021-0030489 | A | 3/2021 |
| TW | 511113 | B | 11/2002 |
| WO | 2021/155270 | A1 | 8/2021 |

* cited by examiner

ACTIVE COOLING OF QUARTZ ENVELOPED HEATERS IN VACUUM

FIELD

Embodiments of the present disclosure relate to active cooling systems for infrared heaters that are disposed in vacuum.

BACKGROUND

The fabrication of a semiconductor device involves a plurality of discrete and complex processes. In certain processes, it may be advantageous to perform one or more of these processes at elevated temperatures.

For example, within an ion source, different gasses may be best ionized at different temperatures. Larger molecules are preferably ionized at lower temperatures to ensure that larger molecular ions are created. Other species may be best ionized at higher temperatures.

Further, certain implants and other processes are best performed at elevated temperature.

These elevated temperatures may be achieved through the use of heaters. In some embodiments, the heater may be disposed in a preheat station, which is used to elevate the temperature of the workpiece prior to processing. In other embodiments, the heaters may be disposed in the end station of a beamline implantation system.

Heaters often contain components with temperature thresholds below the target substrate temperature. In non-vacuum environments, these components are often kept within acceptable temperature limits by free and forced convection of atmospheric fluids. This method of heat dissipation is not available in vacuum.

Exceeding these temperatures may have deleterious effects. Specifically, for commercially available lamps, halogen cycles commonly have an optimal operating temperature range between 250° C. and 600° C. at the bulb surface, outside of which the halogen cycle can break down eventually leading to lamp failure. Quartz glass commonly used in infrared lamp construction often has a threshold below 1000° C., which is often an upper limit on glass temperature for non-halogen based infrared lamps. Glass to metal seals for infrared lamps often have upper limits of temperature tolerance between 300° C. and 600° C.

Therefore, it would be advantageous if there were cooling system that utilized other methods of heat dissipation in order to maintain these sensitive heater components within acceptable temperature thresholds while operating in vacuum conditions. It would also be beneficial if this cooling system could be utilized with existing heating lamps.

SUMMARY

A heater assembly that is effective at maintaining heating lamps at acceptable temperatures in vacuum conditions is disclosed. The heater assembly utilizes radiative heat transfer to transfer heat from the heating lamps to a cooling base. One or more high emissivity films are disposed between the heating lamps and the cooling base to facilitate the heat transfer. Further, a reflective coating is applied to a portion of the heating lamps to reflect heat away from the cooling base. The heater assembly may be utilized in a high vacuum environment as it does not rely on convective cooling.

According to one embodiment, a heater assembly is disclosed. The heater assembly comprises one or more heating lamps, each having a filament encased in a tube; a cooling base, having one or more troughs; wherein each of the one or more heating lamps is disposed in a respective one of the one or more troughs, wherein a region where the heating lamp contacts the respective trough is referred to as a contact area; a reflective coating applied to the tube so as to reflect heat away from the contact area and toward a target to be heated; and a high emissivity film disposed between the one or more heating lamps and the respective troughs in the contact area so as to enhance radiative heat transfer. In some embodiments, the high emissivity film is applied to the cooling base in the one or more troughs, such that the reflective coating is disposed between the filament and the high emissivity film. In some embodiments, the reflective coating is applied to an interior surface of the tube, and the high emissivity film is applied to an outer surface of the tube. In some embodiments, the reflective coating is applied to an outer surface of the tube, and the high emissivity film is applied on the reflective coating. In some embodiments, the cooling base comprises a coolant inlet and a coolant outlet to allow a flow of coolant through the cooling base. In some embodiments, the cooling base comprises an upper lamp housing attached to a lower cooling base, wherein the troughs are disposed in the upper lamp housing. In certain embodiments, the one or more heating lamps are bonded to the cooling base. In some embodiments, the cooling base is made of quartz. In certain embodiments, 50% or less of an outer surface of the tube contacts the respective trough. In some embodiments, the high emissivity film has an emissivity of at least 0.90.

According to another embodiment, an ion implantation system is disclosed. The ion implantation system comprises the heater assembly described above, an ion source, a mass analyzer and an end station, wherein the heater assembly and a workpiece are disposed in the end station.

According to another embodiment, a heater assembly is disclosed. The heater assembly comprises a heating lamp, comprising one or more filaments encased in an enclosure, the enclosure comprising a bottom wall, a plurality of sidewalls and a translucent surface; a cooling base, having a top surface; wherein the bottom wall of the heating lamp is disposed above the top surface of the cooling base; a reflective coating applied to the bottom wall so as to direct heat away from cooling base and toward the translucent surface and a target to be heated; and a high emissivity film disposed between the heating lamp and the top surface of the cooling base so as to enhance radiative heat transfer. In some embodiments, the enclosure comprises a rectangular prism, a cylinder or a tube. In some embodiments, the high emissivity film is applied to the top surface of the cooling base. In certain embodiments, the reflective coating is applied to an interior surface of the bottom wall, and the high emissivity film is applied to an outer surface of the bottom wall. In some embodiments, the reflective coating is applied to an outer surface of the bottom wall, and the high emissivity film is applied on the reflective coating. In certain embodiments, the cooling base comprises a coolant inlet and a coolant outlet to allow a flow of coolant through the cooling base. In some embodiments, the high emissivity film has an emissivity of at least 0.90.

According to another embodiment, an ion implantation system is disclosed. The ion implantation system comprises the heater assembly described above, an ion source, a mass analyzer and an end station, wherein the heater assembly and a workpiece are disposed in the end station.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain embodiments, it is beneficial to process a semiconductor process at an elevated temperature, such as between 700° C. and 1000° C. or higher. Typically, this may be accomplished by using heating lamps. These heating lamps emit infrared radiation, and therefore may be referred to as infrared heating lamps. These heating lamps may emit energy in a specific spectrum, such as short wave (SWIR), medium wave (MWIR) and long wave (LWIR). Other wavelengths may also be targeted for the heating system. However, as described above, due to the vacuum conditions, it is difficult to cool the heating lamps, resulting in shortened life and reduced throughput. The ability to effectively cool these heating lamps would be beneficial. The present disclosure described several embodiments of a heater assembly which utilizes radiative heat transfer to transfer heat from the heating lamps to a cooling base.

Figure 1A:
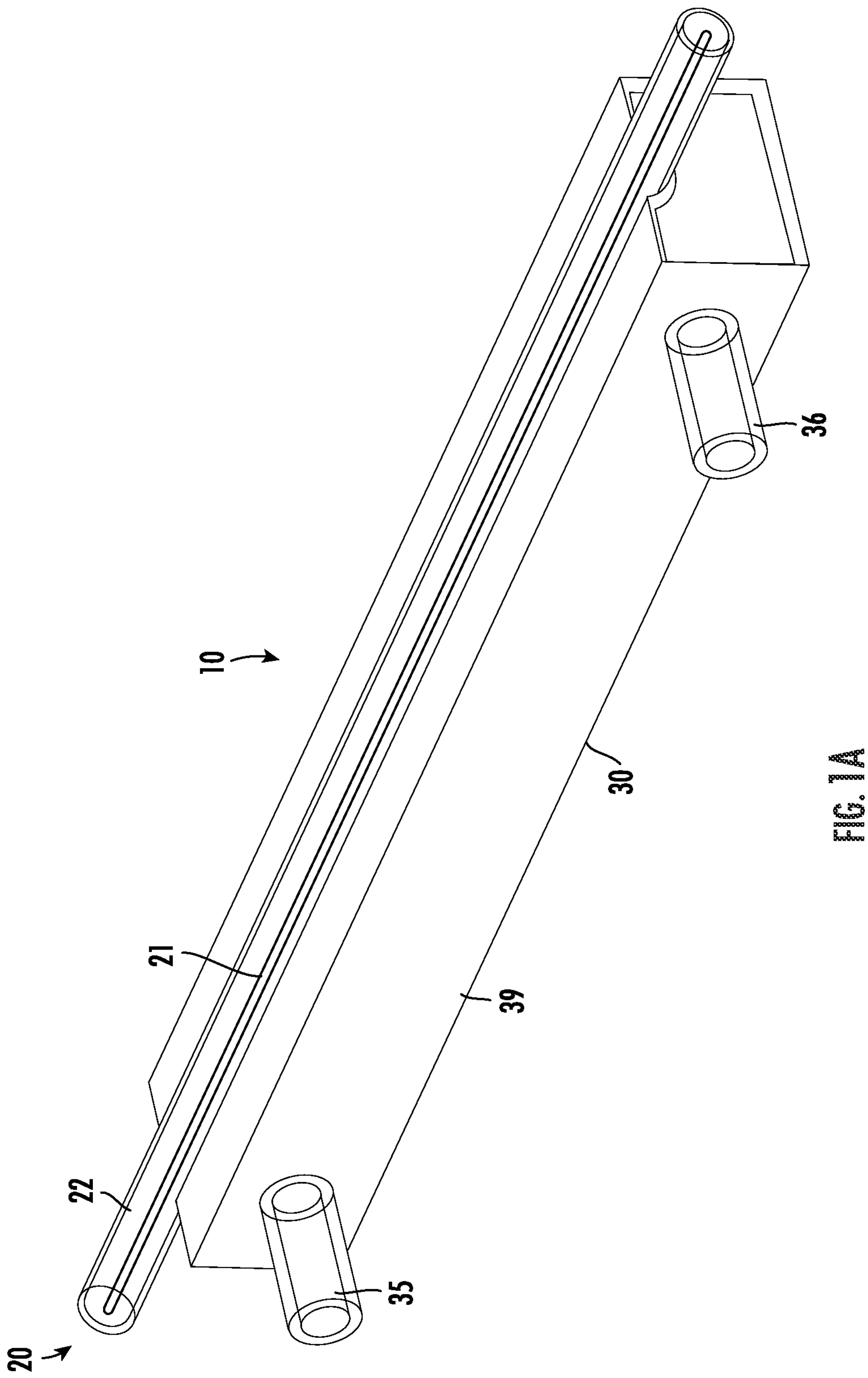
FIGS. 1A-1B show a heating lamp and cooling system according to one embodiment.
Figure 1B:
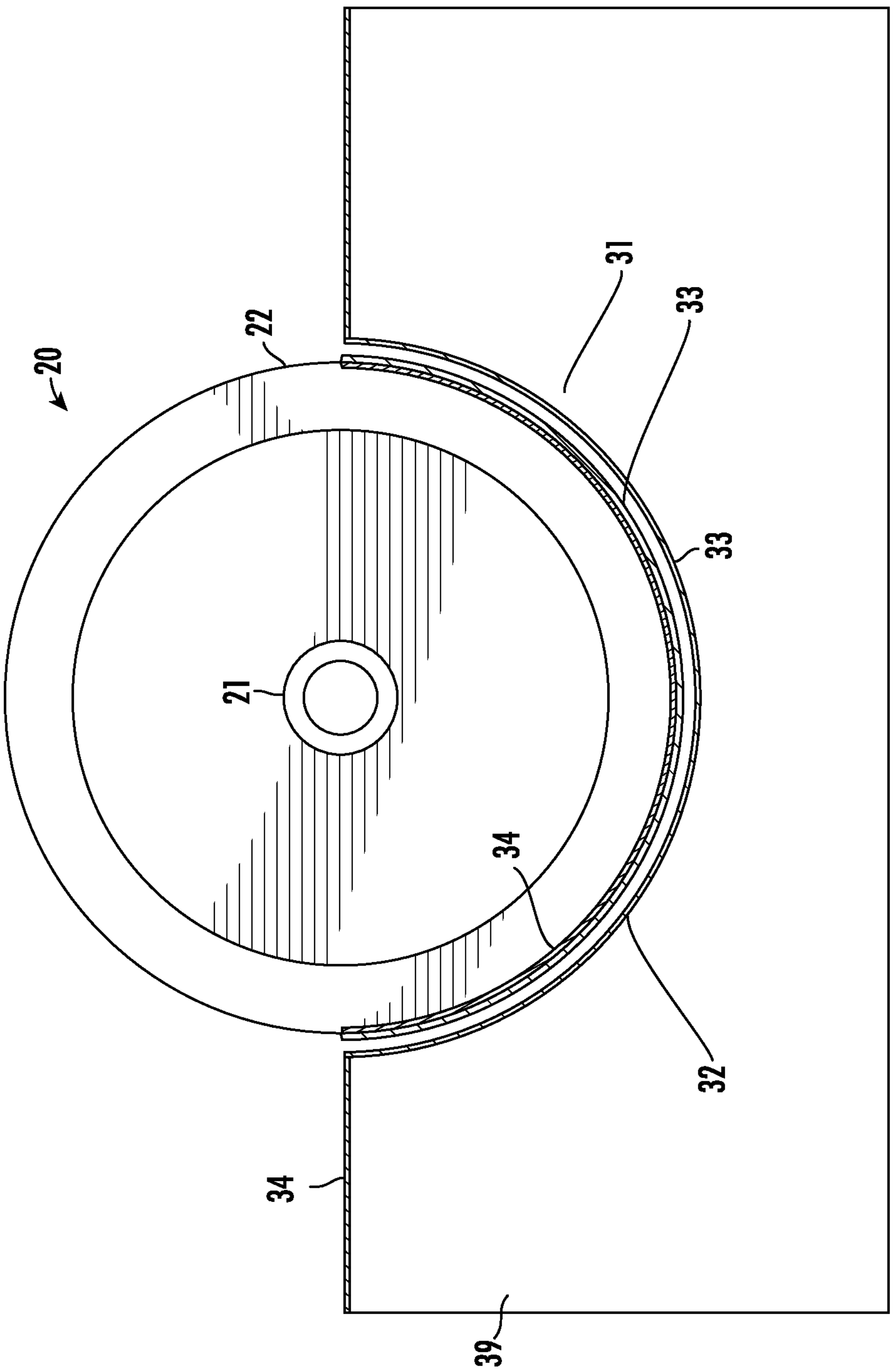

FIG. 1A shows a heater assembly 10, which includes a heating lamp 20 and a cooling system 30 according to one embodiment. FIG. 1B shows a cross-sectional view of the heater assembly 10.

The heating lamp 20 may be an infrared lamp having a filament 21 disposed within a tube 22, such as a quartz tube. The filament 21 extends from one end of the tube 22 to the opposite end of the tube 22. The diameter of the tube 22 is not limited by this disclosure. Alternatively, the heating lamp 20 may be a halogen lamp. The tube 22 is made of a transparent or translucent material such that most of the heat and radiation emitted by the heating lamp may pass through the tube 22.

In this embodiment, the cooling system 30 includes a cooling base 39 having a coolant inlet 35 and a coolant outlet 36. The cooling base 39 may be constructed of any suitable material, such as quartz or metal. Coolant is pumped into the cooling system 30 via the coolant inlet 35 and warmed coolant exits the cooling system 30 through the coolant outlet 36. As best seen in FIG. 1B, the top surface of the cooling base 39 includes a trough 31. The trough 31 is dimensioned such that the heating lamp 20 may be disposed in the trough 31. In other words, the radius of curvature of the trough 31 is nearly equal to the outer radius of the heating lamp 20. In this disclosure, the term "nearly equal" denotes that the radius of curvature of the trough 31 and the outer radius of the heating lamp 20 differ by less than 10 thousandths of an inch.

In this configuration, a portion of the heating lamp 20 is in contact with the cooling base 39. In some embodiments, the trough 31 may be dimensioned such that up to half of the outer surface of the tube 22 contacts the trough 31, such as is shown in FIG. 1B. Of course, the trough 31 may be configured such that a smaller percentage of the outer surface of the tube 22 contacts the trough 31. The region in which the heating lamp 20 contacts the trough 31 is referred to as the contact area 32.

In certain embodiments, the heating lamp 20 is directly bonded to the cooling base 39. For example, if the cooling base 39 is quartz, the tube 22 and the cooling base 39 may be directly bonded. Other types of glass-to-glass adhesives may also be used. However, in other embodiments, the components are not bonded together.

As shown in FIG. 1B, a high emissivity film 33 is disposed between the heating lamp 20 and the trough 31 in the contact area 32. The high emissivity film 33 may be a black film, a black paint or another suitable material. The high emissivity film 33 may have an emissivity of at least 0.90 for the majority of wavelengths in the range of wavelengths of interest. In this way, the high emissivity film 33 may achieve near black body emissivity, maximizing radiative heat transfer potential. In some embodiments, the high emissivity film 33 may be disposed in the trough 31 of the cooling base 39. In some embodiments, the high emissivity film 33 may be disposed on the outer surface of the tube 22, on that portion that contacts the trough 31. In some embodiments, the high emissivity film 33 may be disposed on the outer surface of the tube 22 and also disposed in the trough 31.

As an example, in FIG. 1B, the high emissivity film 33 may be disposed in the trough 31 and/or on the portion of the outer surface of the heating lamp 20 that is in the contact area 32. The high emissivity film 33 allows superior cooling via radiative heat transfer between the heating lamp 20 and the cooling base 39.

The high emissivity film 33 may be deposited by electroless deposition, or various other deposition processes. Alternatively, the high emissivity film 33 may be applied as an adhesive (spray or painted on) and heated to high temperatures to bond. In other embodiments, the high emissivity film 33 may be sintered to the surface.

A reflective coating 34 is also applied to the heating lamp 20. The reflective coating 34 may have a reflectance of more than 0.4. In certain embodiments, the reflective coating 34 may have a reflectance of more than 0.5. In certain embodiments, the reflective coating 34 may have a reflectance of more than 0.7. In certain embodiments, the reflective coating 34 may have a reflectance of more than 0.9. The reflective coating 34 may be applied by deposition or some other method. The reflective coating may be gold, aluminum oxide, boron nitride, quartz, fused silica, or other suitable materials. The reflective coating 34 is applied to the heating lamp 20 in a location such that the reflective coating 34 is between the filament 21 and the high emissivity film 33. In one embodiment, the reflective coating 34 may be applied on the inner surface of the tube 22 in the region that is proximate to the contact area 32 so as to reflect light away from the contact area 32 and through the tube toward the target to be heated. In another embodiment, the reflective coating 34 may be applied to the outer surface of the tube 22 in the contact area 32.

The high emissivity film 33 is disposed in only those surfaces where the heat from the heating lamp is first reflected by the reflective coating 34. In other words, reflective coating 34 may always be disposed between the filament 21 and the high emissivity film 33.

In certain embodiments, the reflective coating 34 may be applied to the outer surface of the tube 22. After the reflective coating 34 has been applied, the high emissivity film 33 may be applied on top of the reflective coating 34.

In other embodiments, the reflective coating 34 may be applied to the interior surface of the tube 22 while the high emissivity film is disposed on the outer surface of the tube 22. The reflective coating 34 may have a thickness of between 1 and 10 thousandths of an inch, depending on the type of material that is used.

In this way, light in the heating lamp 20 first encounters the reflective coating 34, which reflects the light away from the cooling base 39 and toward the target to be heated. The heat that is created in the heating lamp 20 is transferred to the cooling base 39 through radiative heat transfer enabled by the high emissivity film 33. In this way, the light output of the heating lamp 20 is maximized and the heat is drawn away from the heating lamp 20.

Further, reflective coating 34 may also be disposed on the top surface of the cooling base 39. Heat shields and/or other reflective surfaces can also be positioned to direct energy away from the cooling base 39 and contain only the energy intended to be dissipated from the heating lamp 20.

Figure 2:
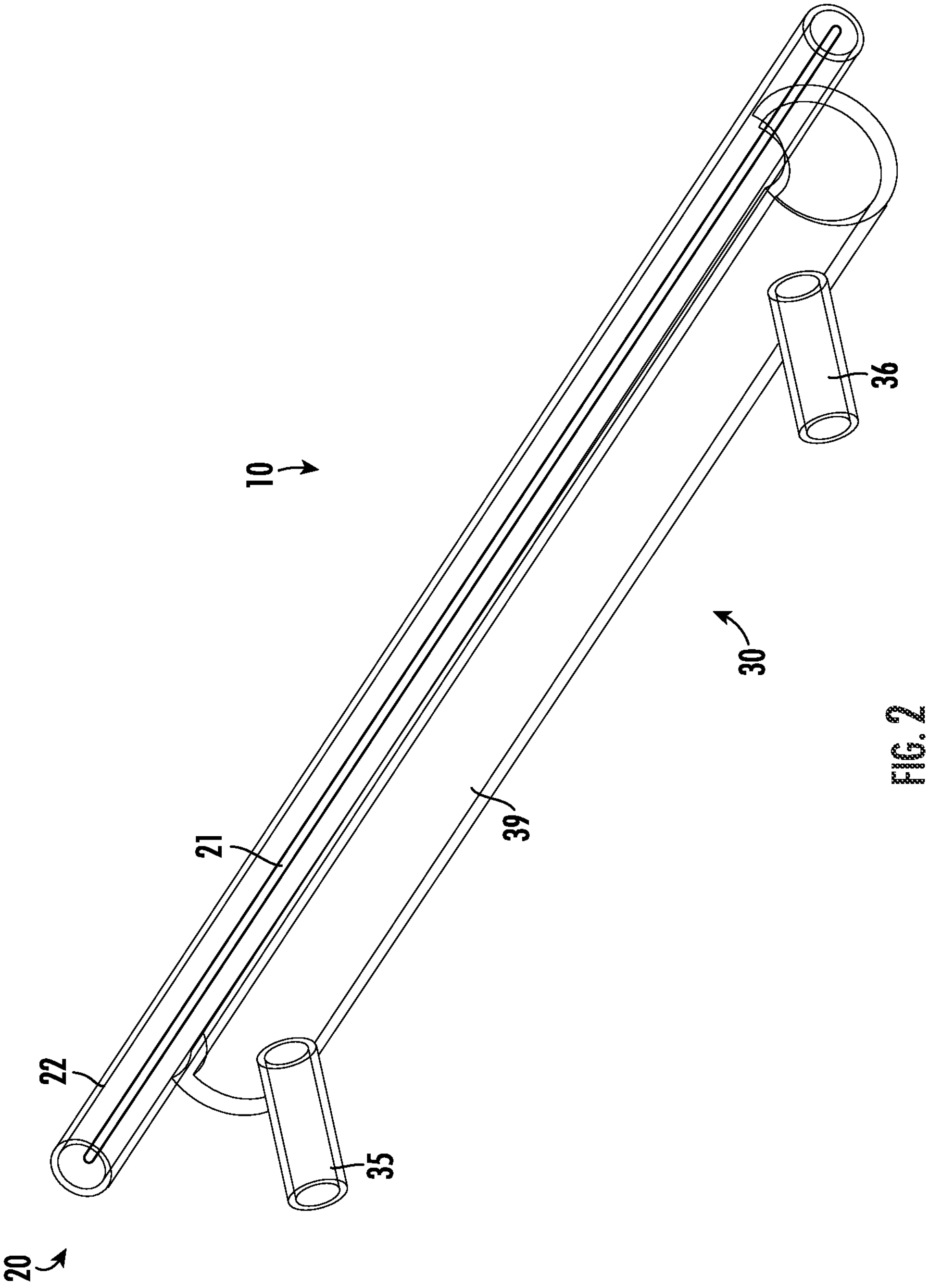
FIG. 2 shows the heating lamp and cooling system according to another embodiment.

FIGS. 1A-1B show the cooling base 39 in the shape of a rectangular prism with a trough 31 on the top surface. However, other shapes may also be used. For example, FIG. 2 shows a cooling base 39 that is a cylinder with a trough 31 on a top surface. Of course, the cooling base 39 may have other shapes as well.

Figure 3A:
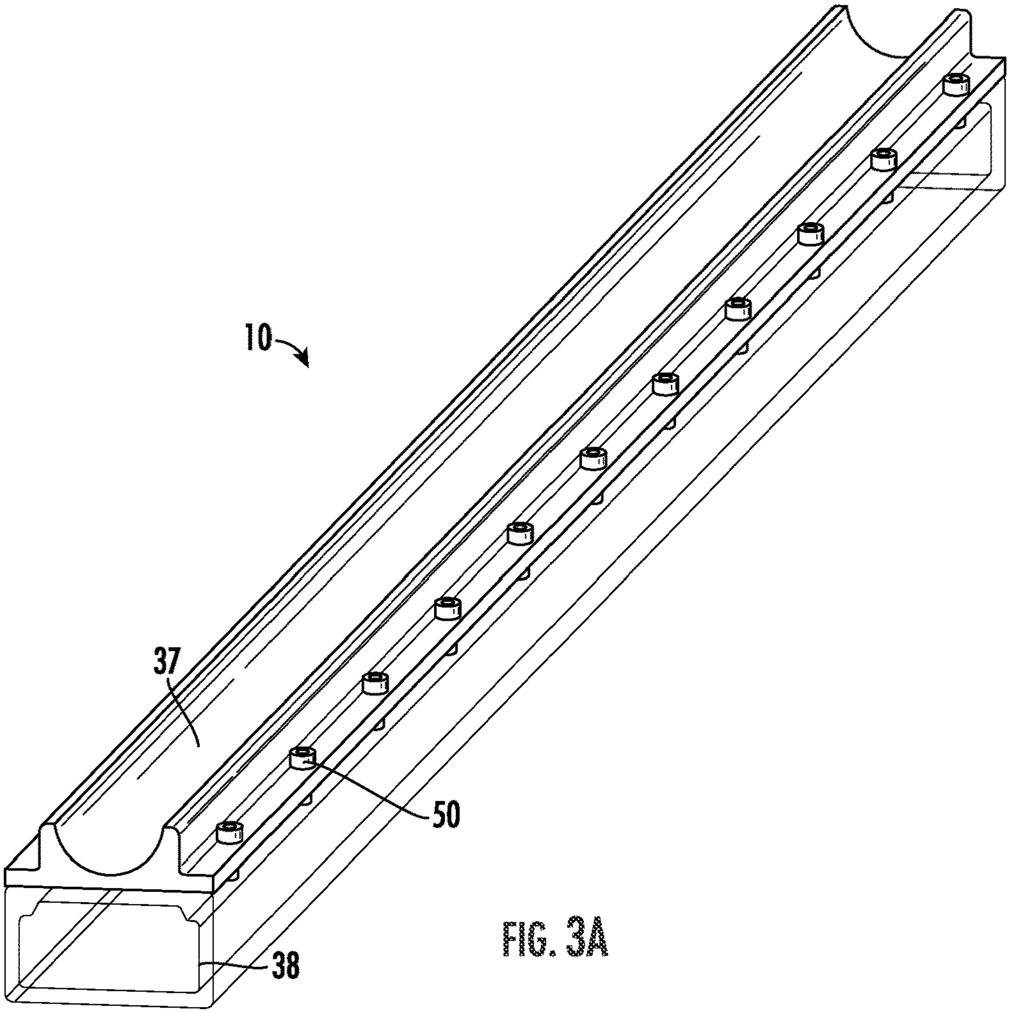
FIGS. 3A-3B show the cooling system according to another embodiment.
Figure 3B:
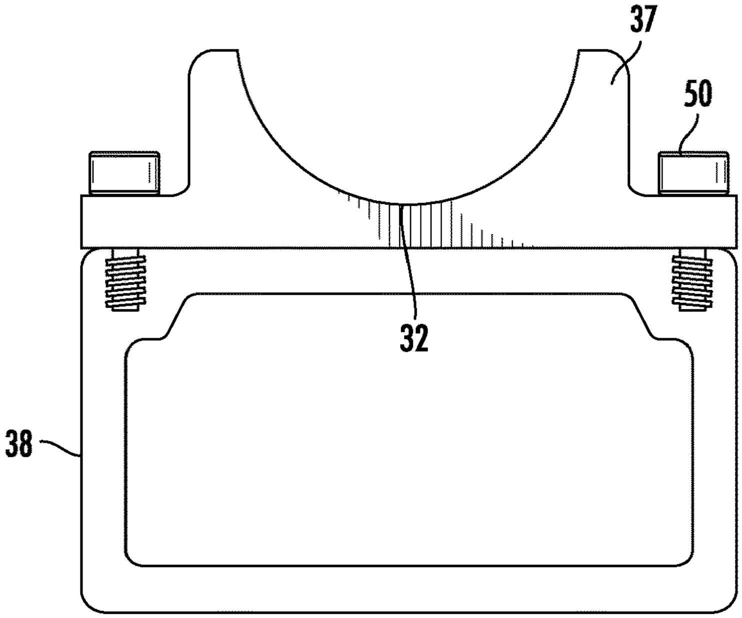

In FIGS. 1A-1B and 2, the heating lamp 20 is in direct contact with the cooling base 39, which is an integral component. However, other embodiments are also possible. FIGS. 3A-3B show a heater assembly wherein the cooling base 39 comprises a plurality of components, including a lower cooling base 38 and an upper lamp housing 37. FIG. 3B is a cross-sectional view of the heater assembly shown in FIG. 3A. The upper lamp housing 37 may have a trough on its top surface. The upper lamp housing 37 may be metal, such as aluminum. In other embodiments, the upper lamp housing 37 may be made of a different material. The bottom surface of the upper lamp housing 37 may be flat. As described above, the trough may be coated with a high emissivity film 33 to improve thermal conductance between the heating lamp 20 and the upper lamp housing 37. The lower cooling base 38 may have a flat top surface, that is adapted to contact the bottom surface of the upper lamp housing 37.

In some embodiments, the heating lamp 20 may be bonded directly to the upper lamp housing 37. In other embodiments, the heating lamp is simply disposed in the trough. The upper lamp housing 37 may be secured to the lower cooling base 38 using fasteners 50, such as screws. Additionally, vacuum compatible grease may be disposed between the bottom surface of the upper lamp housing 37 and the top surface of the lower cooling base 38 to facilitate heat transfer.

The cooling bases 39 described above may dissipate the heat by having a coolant, such as a liquid or a gas, flow through the cooling base, as shown in FIGS. 1A and 2. Alternatively or additionally, the cooling bases 39 may include other features to dissipate heat, such as fins.

Figure 4A:
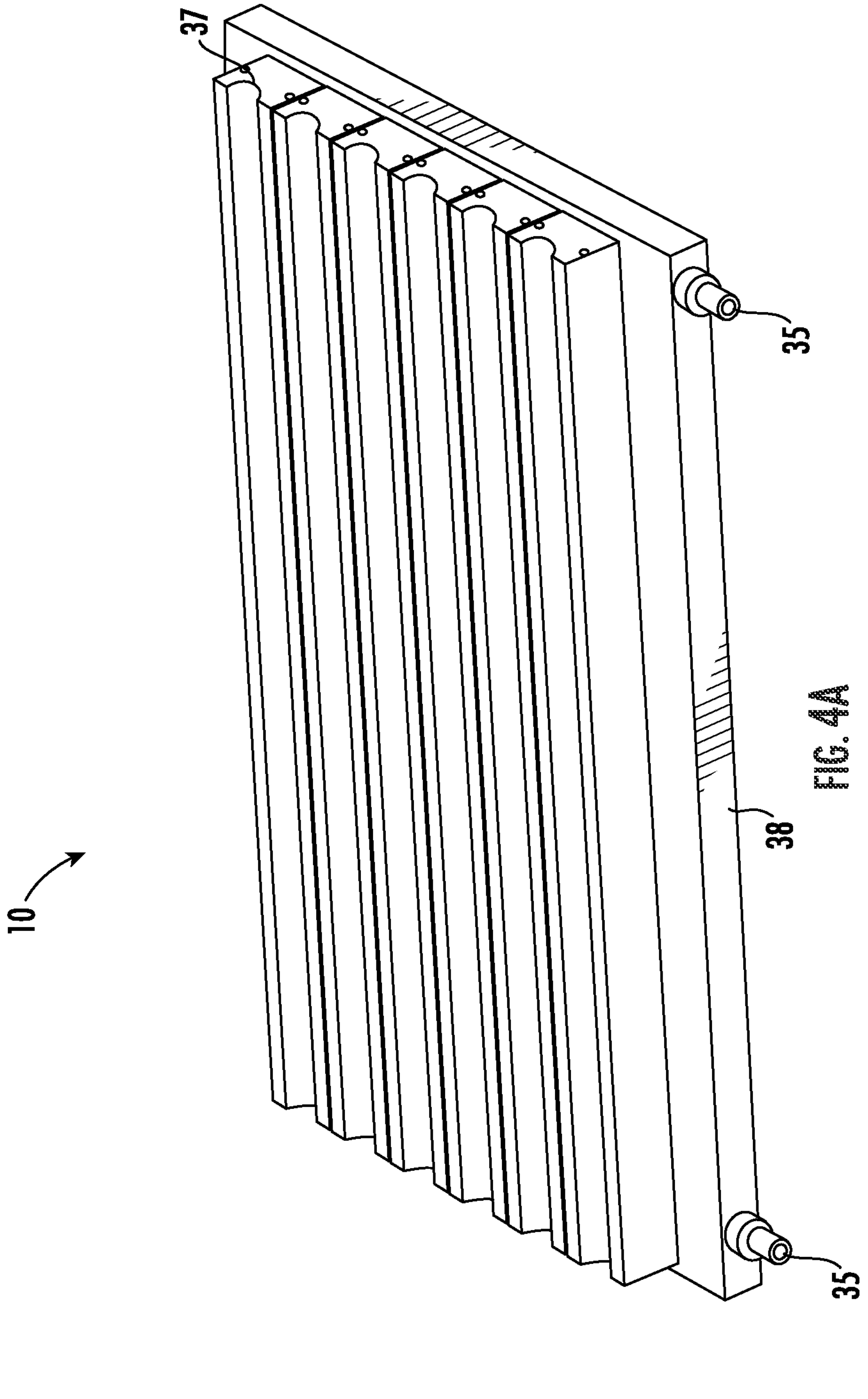
FIGS. 4A-4B show a cooling system that holds multiple heating lamps according to one embodiment.
Figure 4B:
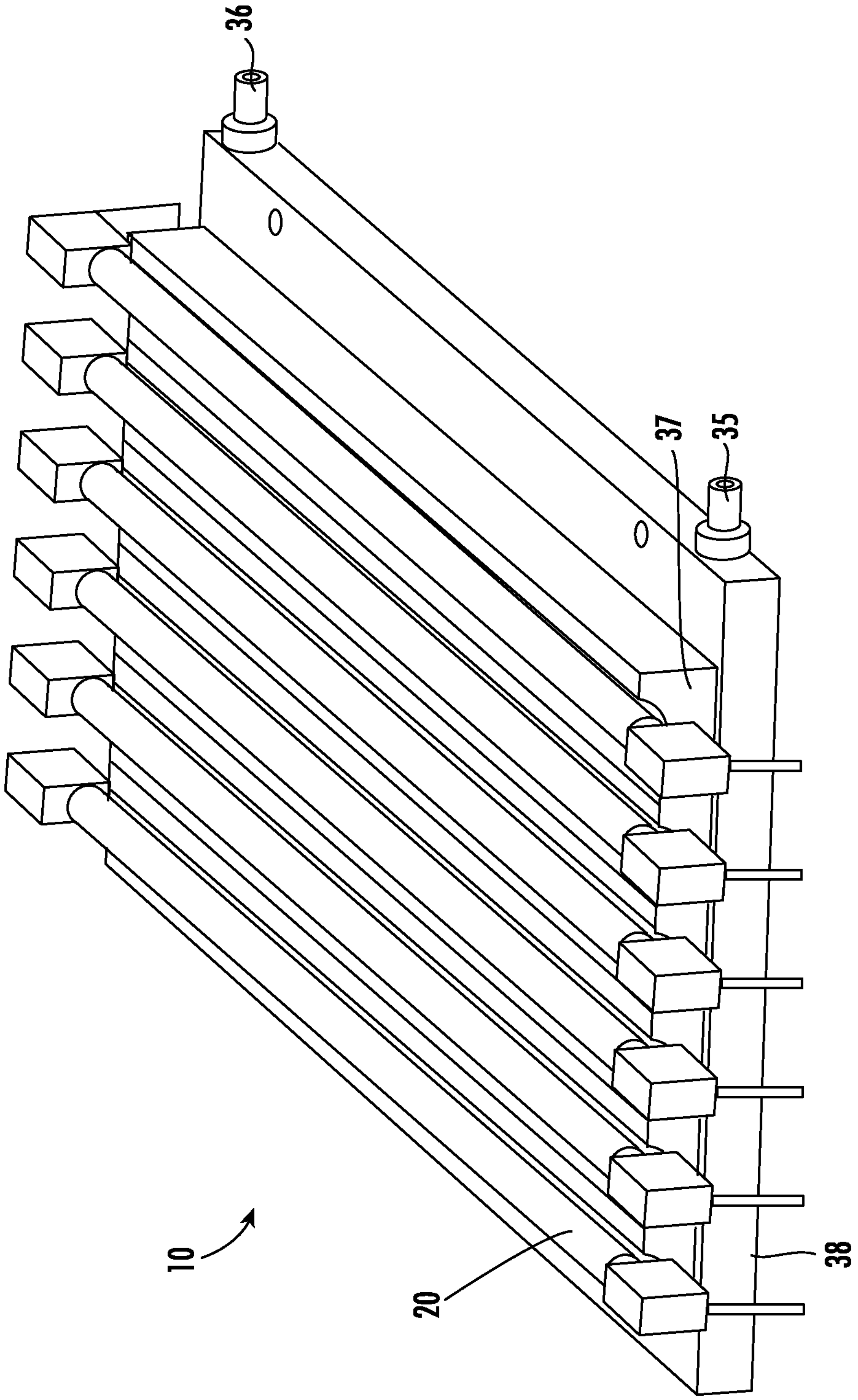

Further, while the previous figures show a single heating lamp, multiple heating lamps may be utilized with a single cooling base. FIGS. 4A-4B show a heater assembly wherein a plurality of heating lamps 20 are disposed on one cooling base 39. FIG. 4A shows an exploded view, while FIG. 4B shows the heater assembly with heating lamps 20 installed. In this embodiment, an upper lamp housing 37 has six troughs, which are used to hold six heating lamps 20, as shown in FIG. 4B. The upper lamp housing 37 is attached to the lower cooling base 38 as described above. Further, coolant inlets 35 and coolant outlets 36 may be disposed in the lower cooling base 38.

In another embodiment, an integral cooling base, such as that shown in FIGS. 1A-1B may be expanded to contain a plurality of troughs so as to support a plurality of heating lamps 20.

In each of these embodiments, the heater assembly comprises one or more heating lamps 20 and a cooling base 39. The heating lamps may include a filament 21 encased in a tube 22, such as a quartz tube. A reflective coating 34 is applied to the portion of the tube 22 that corresponds to the contact area 32. In some embodiments, the reflective coating 34 is applied to the interior surface of the tube 22 on the portion corresponding to the contact area 32. In some embodiments, the reflective coating 34 is applied to the outer surface on the tube 22 on the portion corresponding to the contact area 32. Further, the reflective coating 34 may be applied to the top surface of the cooling base 39 except in the contact area 32. A high emissivity film 33 is disposed between the outer surface of the tube 22 and the trough 31. In certain embodiments, the high emissivity film 33 is applied to the top surface of the trough 31. In some embodiments, the high emissivity film 33 is applied to the outer surface of the tube 22 in the contact area 32. In certain embodiments, the high emissivity film is applied to both surfaces. Further, as noted above, in some embodiments, the reflective coating 34 is applied to the outer surface of the tube 22, and the high emissivity film 33 is disposed on top of the reflective coating 34.

The description above discloses a cooling base 39 for use with one or more heating lamps, which are in the form of tubes 22. However, other embodiments are also possible.

Figure 5A:
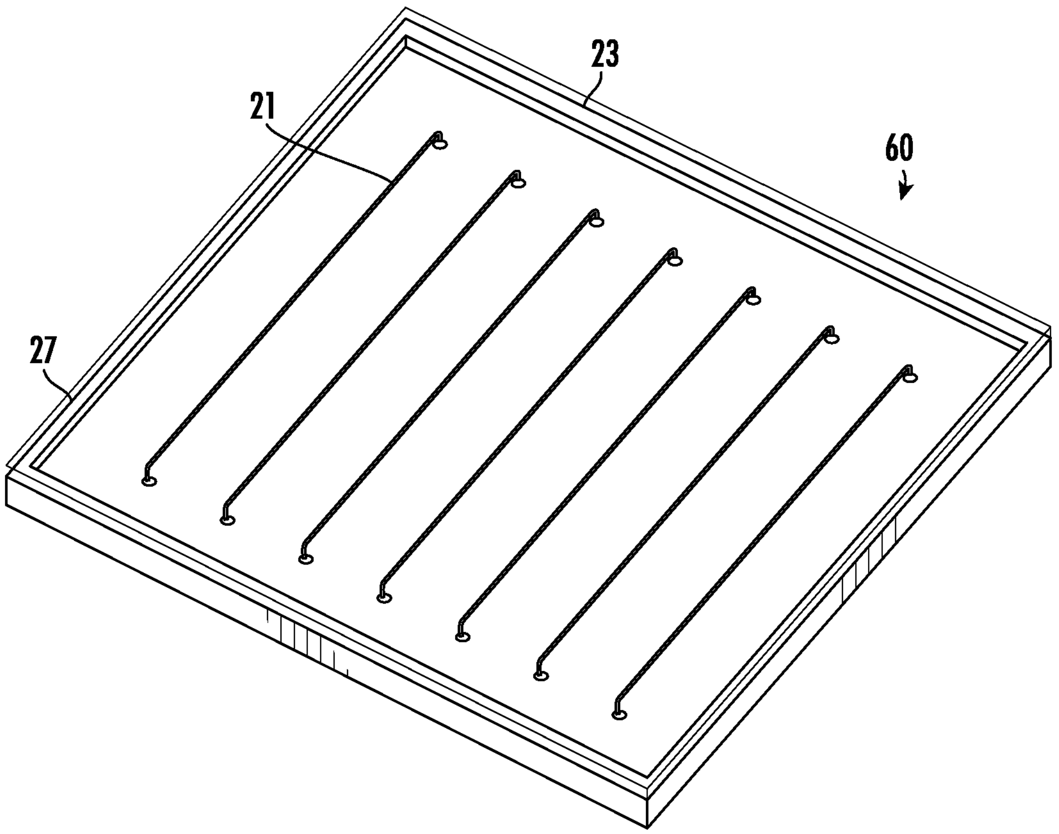
FIGS. 5A-5C show a heating lamp according to another embodiment.
Figure 5B:
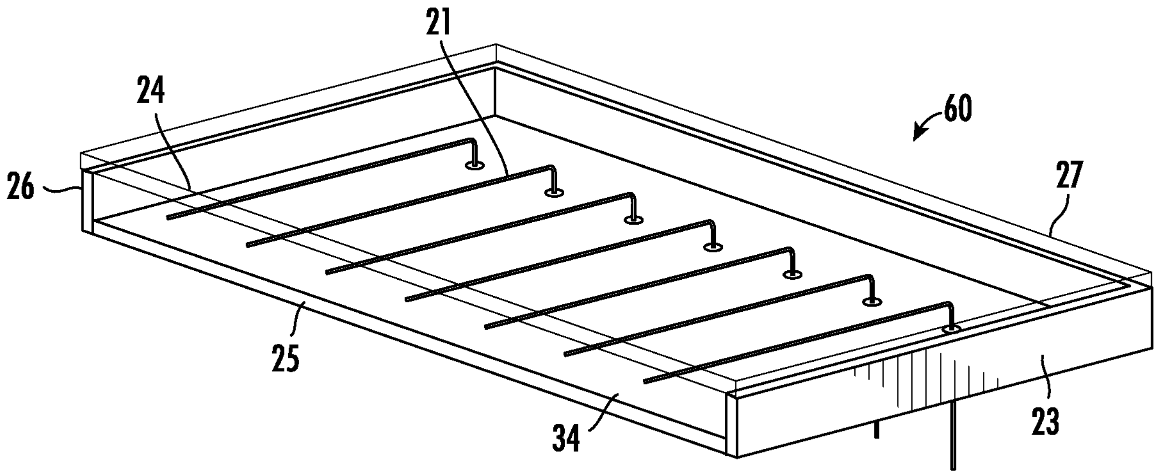
Figure 6:
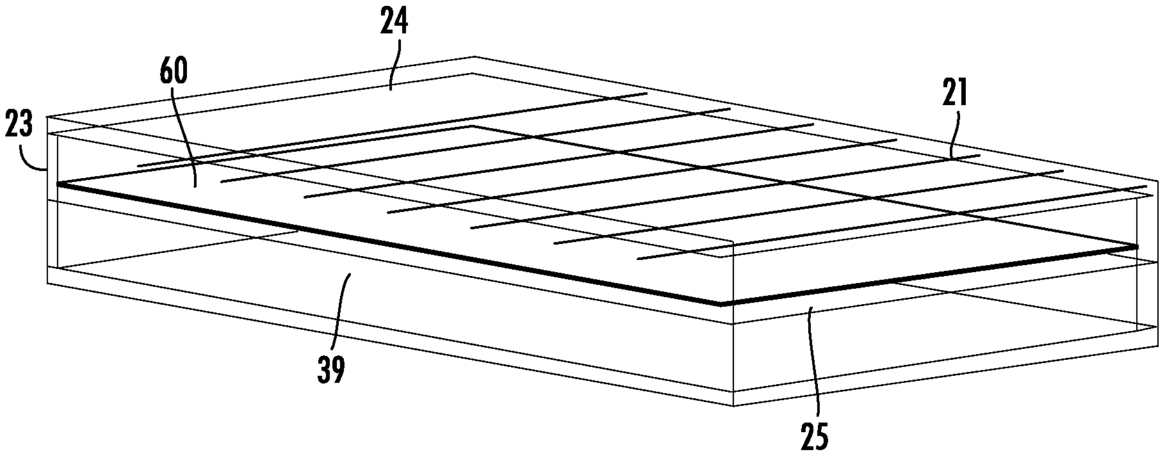
FIG. 6 shows a heater assembly using the heating lamp shown in FIG. 5C.

FIGS. 5A-5B show a heating lamp 60 that is formed as an enclosure 27 containing one or more filaments 21. The enclosure 27 may include a housing 23 and a translucent surface 24. The translucent surface 24 may be made of a transparent or translucent material, such as quartz. In this way, most of the heat and radiation generated by the heating lamp 60 may pass through the translucent surface 24 and toward the target to be heated. The housing 23 may be made of any suitable material, including a metal. In some embodiments, the housing 23 is constructed of quartz. The housing 23 may include a bottom wall 25 and a plurality of sidewalls 26. In some embodiments, enclosure 27, which includes the housing 23 and the translucent surface 24 may be an integral component. The enclosure 27 may be a rectangular prism, as shown in FIG. 6 or may be another shape. For example, a double bore tube may be used.

Figure 5C:
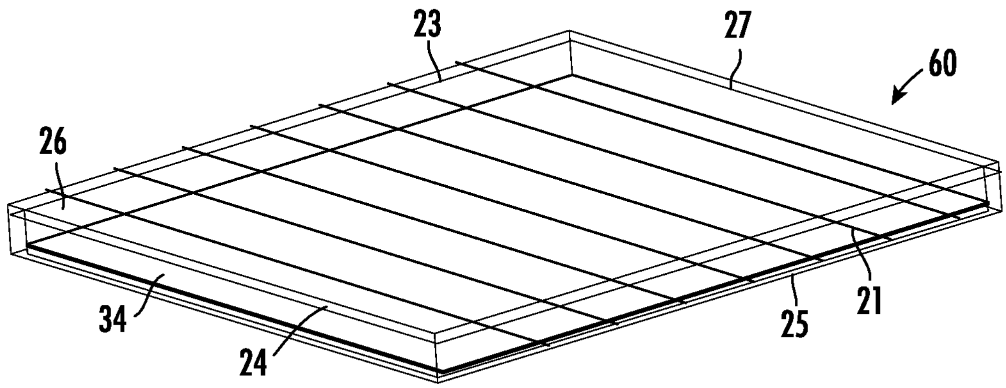

The ends of the filaments 21 may exit the housing 23 via the bottom wall 25, as shown in FIGS. 5A-5B. In other embodiments, the ends of the filament 21 may exit the housing 23 via the sidewalls 26, as shown in FIG. 5C. The ends of the filaments 21 may each exit the housing 23 separately. In other embodiments, electrical connections to the filaments 21 may be made within the housing 23 to reduce the number of external wires and glass to metal penetrations and seals.

The reflective coating 34 is applied to at least one surface of the housing 23. The reflective coating 34 may be applied to the bottom wall 25 of the housing 23. In some embodiments, the reflective coating 34 is applied to the interior surface of the bottom wall 25 of the housing 23. In other embodiments, if the housing 23 is quartz or another translucent material, the reflective coating is applied to the outer surface of the bottom wall 25 of the housing 23. In some embodiments, the reflective coating 34 may also be applied to the interior or outer surfaces of one or more of the sidewalls 26.

FIG. 6 shows a heater assembly that includes the heating lamp 60 of FIG. 5C and a cooling base 39. Note that the heater assembly may also be constructed using the heating lamp 60 of FIGS. 5A-5B. In FIG. 6, the cooling base 39 has a top surface to contact the bottom wall 25 of the enclosure 27 of the heating lamp 60. If the bottom wall 25 of the housing 23 is flat, the top surface of the cooling base 39 may also be flat. If the outer surface of the bottom wall is not planar, the top surface of the cooling base 39 may have a similar contour so as to contact the bottom wall 25. In certain embodiments, these surfaces may be fused together. A high emissivity film 33 may be disposed on the outer surface of the bottom wall 25 in the contact area. Alternatively, or additionally, a high emissivity film 33 may be disposed on the top surface of the cooling base 39 in the contact area.

In some embodiments, the reflective coating 34 is applied to the outer surface of the bottom wall 25. Following this application, the high emissivity film may be applied on top of the reflective coating 34 on the outer surface of the bottom wall 25.

Although not shown, the cooling base 39 in FIG. 6 may have a coolant inlet and a coolant outlet, similar to those shown in FIGS. 1A and 2.

Thus, in this embodiment, the heater assembly comprises a heating lamp, which includes one or more filaments 21 disposed in an enclosure 27, which may be shaped as a rectangular prism, a cylinder or a tube as is common for both lamps and heat exchangers. The enclosure 27 is made of a translucent surface 24 and a housing 23. A reflective coating 34 is applied to a surface of the bottom wall of the housing 23. A high emissivity film 33 is applied between the housing 23 and the cooling base 39. As noted above, the high emissivity film 33 may be disposed on the outer surface of the bottom wall 25 and/or the top surface of the cooling base 39 in the contact area. The reflective coating may be applied to the interior or outer surface of the bottom wall 25.

Figure 7:
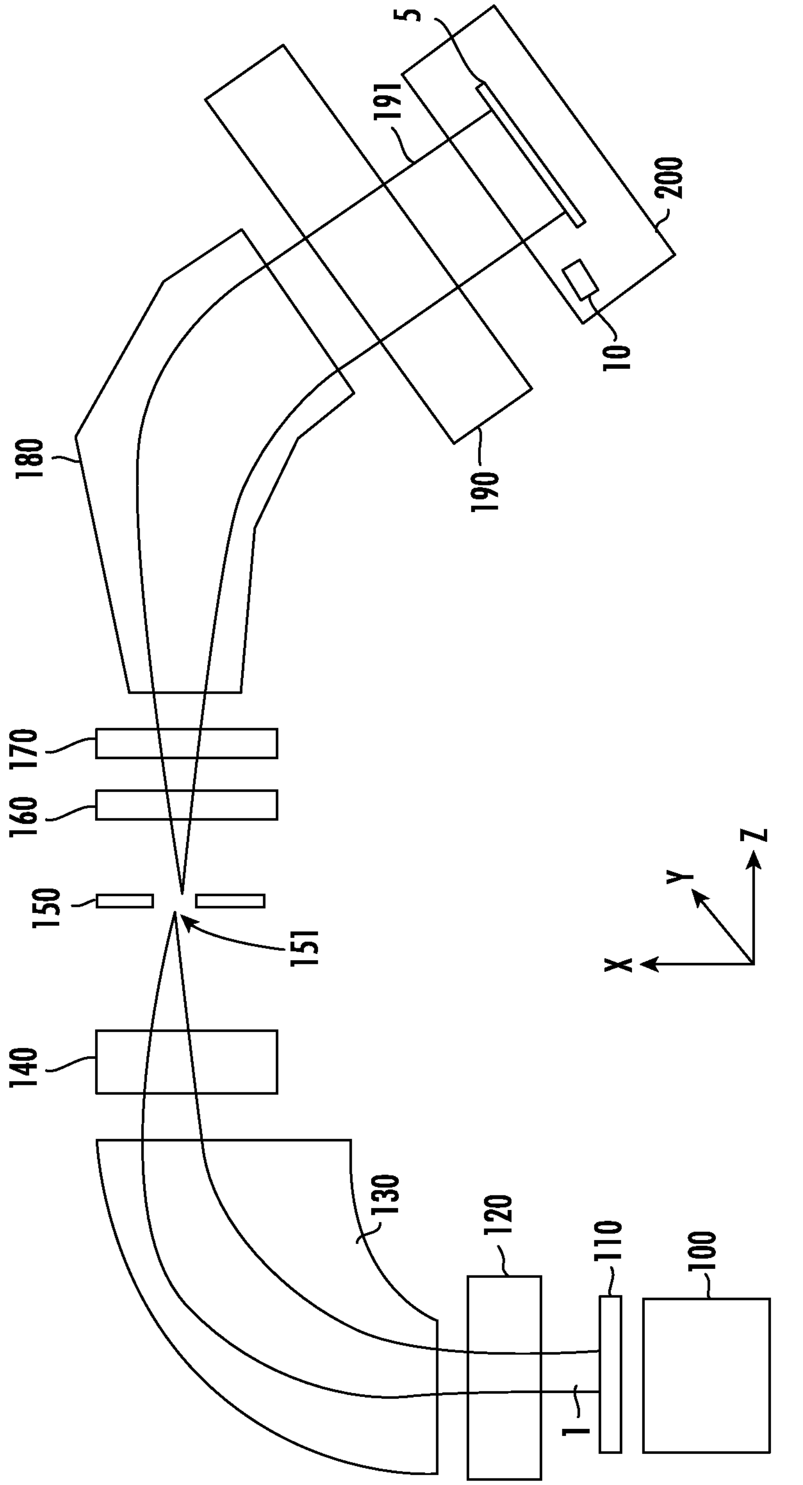
FIG. 7 illustrates an ion implantation system using the heater assembly described herein.

The heater assembly described herein may be used in many applications. As shown in FIG. 7, heater assembly may be disposed in the end station of a beam line implantation system. The beam line ion implantation system may be used for processing a workpiece using a ribbon ion beam or a spot ion beam.

The beam line ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 5. The workpiece 5 may be a silicon wafer, or may be another wafer suitable for semiconductor manufacturing, such as GaAs, GaN or GaP. The extraction aperture may be any suitable shape. In certain embodiments, the extraction aperture may be oval or rectangular shaped, having one dimension, referred to as the width (x-dimension), which may be much larger than the second dimension, referred to as the height (y-dimension).

Disposed outside and proximate the extraction aperture of the ion source 100 are extraction optics 110. In certain embodiments, the extraction optics 110 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the aperture in the extraction optics are aligned such that the ions 1 pass through both apertures.

Located downstream from the extraction optics 110 may be a first quadrupole lens 120. The first quadrupole lens 120 cooperates with other quadrupole lenses in the system to focus the ions 1 into an ion beam.

Located downstream from the first quadrupole lens 120 is a mass analyzer 130. The mass analyzer 130 uses magnetic fields to guide the path of the extracted ions 1. The magnetic fields affect the flight path of ions according to their mass and charge. A mass resolving device 150 that has a resolving aperture 151 is disposed at the output, or distal end, of the mass analyzer 130. By proper selection of the magnetic fields, only those ions 1 that have a selected mass and charge will be directed through the resolving aperture 151. Other ions will strike the mass resolving device 150 or a wall of the mass analyzer 130 and will not travel any further in the system.

A second quadrupole lens 140 may be disposed between the output of the mass analyzer 130 and the mass resolving device 150.

A collimator 180 is disposed downstream from the mass resolving device 150. The collimator 180 accepts the ions 1 that pass through the resolving aperture 151 and creates a ribbon ion beam formed of a plurality of parallel or nearly parallel beamlets. The output, or distal end, of the mass analyzer 130 and the input, or proximal end, of the collimator 180 may be a fixed distance apart. The mass resolving device 150 is disposed in the space between these two components.

A third quadrupole lens 160 may be disposed between the mass resolving device 150 and the input of the collimator 180. A fourth quadrupole lens 170 may also be disposed between the mass resolving device 150 and the input of the collimator 180.

In certain embodiments, the quadrupole lenses may be disposed in other positions. For example, the third quadrupole lens 160 may be disposed between the second quadrupole lens 140 and the mass resolving device 150. Additionally, one or more of the quadrupole lenses may be omitted in certain embodiments.

Located downstream from the collimator 180 may be an acceleration/deceleration stage 190. The acceleration/deceleration stage 190 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF).

The ions 1 exit the acceleration/deceleration stage 190 as an ion beam 191 and enter the end station 200. The ion beam 191 may be a ribbon ion beam. The workpiece 5 is disposed in the end station 200.

Thus, the beam line ion implantation system comprises a plurality of components, terminating in an end station 200. As described above, these components include the ion source 100; the extraction optics 110; the quadrupole lenses 120, 140, 160, 170; the mass analyzer 130; the mass resolving device 150; the collimator 180; and the acceleration/deceleration stage 190. It is noted that one or more of these components may not be included in the beam line ion implantation system.

Further, while the above disclosure describes a ribbon ion beam, which has a width much greater than its height, other embodiments are also possible. For example, a scanned spot beam may enter the end station 200. A scanned spot beam is an ion beam that is typically in the shape of a circle, which is scanned laterally to create the same effect as a ribbon ion beam.

Any of the heater assemblies described herein may also be disposed in the end station 200. In one embodiment, the heater assembly 10 is disposed in a location where it heats the workpiece 5 when the workpiece is outside the path of the ion beam 191. In another embodiment, the heater assembly 10 may be disposed in a location where it is configured to heat the workpiece 5 as the workpiece 5 is being implanted by the ion beam 191.

The present system has many advantages. The use of a reflective coating and high emissivity films enables the heating lamp to be maintained at a lower temperature than would otherwise be possible in an isolated vacuum environment with limited access to other cooling systems and methods. Specifically, the reflective coating reflects light away from the cooling base and into the chamber. Further, the use of high emissivity films allows radiative heat transfer, which serves to transfer the heat from the heating lamps to the cooling base. The cooling base may be equipped with coolant channels and/or fins to allow for heat dissipation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A heater assembly, comprising:

one or more heating lamps, each having a filament encased in a tube;

a cooling base, having one or more troughs; wherein each of the one or more heating lamps is disposed in a respective one of the one or more troughs, wherein a region where the heating lamp directly contacts the respective trough is referred to as a contact area;

a reflective coating applied to the tube so as to reflect heat away from the contact area and toward a target to be heated; and a high emissivity film disposed between and in direct contact with the one or more heating lamps and the respective troughs in the contact area so as to enhance radiative heat transfer, wherein the high emissivity film is applied to the cooling base in the one or more troughs, such that the reflective coating is disposed between the filament and the high emissivity film.

2. The heater assembly of claim 1, wherein the reflective coating is applied to an interior surface of the tube, and a second high emissivity film is applied to an outer surface of the tube.

3. The heater assembly of claim 1, wherein the reflective coating is applied to an outer surface of the tube, and a second high emissivity film is applied on the reflective coating.

4. The heater assembly of claim 1, wherein the cooling base comprises a coolant inlet and a coolant outlet to allow a flow of coolant through the cooling base.

5. The heater assembly of claim 1, wherein the cooling base comprises an upper lamp housing having a bottom surface attached to a lower cooling base, wherein the troughs are disposed in a top surface of the upper lamp housing.

6. The heater assembly of claim 1, wherein the one or more heating lamps are bonded to the cooling base.

7. The heater assembly of claim 6, wherein the cooling base is made of quartz.

8. The heater assembly of claim 1, wherein 50% or less of an outer surface of the tube contacts the respective trough.

9. The heater assembly of claim 1, wherein the high emissivity film has an emissivity of at least 0.90.

10. An ion implantation system, comprising the heater assembly of claim 1, an ion source, a mass analyzer and an end station, wherein the heater assembly and a workpiece are disposed in the end station.

* * * * *